US009576082B2

(12) United States Patent
Sparks et al.

(10) Patent No.: US 9,576,082 B2
(45) Date of Patent: Feb. 21, 2017

(54) IONOSPHERIC SLANT TOTAL ELECTRON CONTENT ANALYSIS USING GLOBAL POSITIONING SYSTEM BASED ESTIMATION

(71) Applicant: California Institute of Technology, Pasadena, CA (US)

(72) Inventors: Lawrence C. Sparks, La Crescenta, CA (US); Anthony J. Mannucci, Pasadena, CA (US); Attila Komjathy, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 694 days.

(21) Appl. No.: 13/939,014

(22) Filed: Jul. 10, 2013

(65) Prior Publication Data

US 2014/0163938 A1    Jun. 12, 2014

Related U.S. Application Data

(60) Provisional application No. 61/670,731, filed on Jul. 12, 2012, provisional application No. 61/837,442, filed on Jun. 20, 2013.

(51) Int. Cl.
*G01S 19/07* (2010.01)
*G06F 17/50* (2006.01)
(Continued)

(52) U.S. Cl.
CPC ............ *G06F 17/5009* (2013.01); *G01S 19/07* (2013.01); *G01S 19/20* (2013.01); *G01S 19/41* (2013.01)

(58) Field of Classification Search
None
See application file for complete search history.

(56) References Cited

U.S. PATENT DOCUMENTS 5,828,336 A * 10/1998 Yunck ................. G01S 19/07
342/357.31
6,040,798 A * 3/2000 Kinal ................... G01S 5/0009
342/352
(Continued)

FOREIGN PATENT DOCUMENTS

WO        2006108227        10/2006

OTHER PUBLICATIONS

L. Sparks, A. Komjathy, and A. J. Mannucci, "Extreme Ionospheric Storms and Their impact on WAAS", 2005, pp. 1-9.*
(Continued)

*Primary Examiner* — Kibrom K Gebresilassie
(74) *Attorney, Agent, or Firm* — Gates & Cooper LLP

(57) ABSTRACT

A method, system, apparatus, and computer program product provide the ability to analyze ionospheric slant total electron content (TEC) using global navigation satellite systems (GNSS)-based estimation. Slant TEC is estimated for a given set of raypath geometries by fitting historical GNSS data to a specified delay model. The accuracy of the specified delay model is estimated by computing delay estimate residuals and plotting a behavior of the delay estimate residuals. An ionospheric threat model is computed based on the specified delay model. Ionospheric grid delays (IGDs) and grid ionospheric vertical errors (GIVEs) are computed based on the ionospheric threat model.

18 Claims, 7 Drawing Sheets

(51) Int. Cl.
  *G01S 19/41* (2010.01)
  *G01S 19/20* (2010.01)

(56) References Cited

U.S. PATENT DOCUMENTS

| | | | | |
|---|---|---|---|---|
| 2006/0017610 A1* | 1/2006 | Komjathy | ............... | G01S 19/08 342/357.31 |
| 2006/0164297 A1 | 7/2006 | Hernandez-Pajares et al. | | |
| 2009/0115656 A1* | 5/2009 | Raman | ................... | G01S 19/47 342/357.24 |
| 2009/0135056 A1* | 5/2009 | Dai | ....................... | G01S 19/44 342/357.31 |
| 2009/0224969 A1 | 9/2009 | Kolb | | |
| 2010/0013645 A1 | 1/2010 | Meier et al. | | |
| 2010/0156709 A1* | 6/2010 | Zhang | .................... | G01S 19/43 342/357.23 |
| 2011/0050492 A1* | 3/2011 | Um | ....................... | G01S 19/07 342/357.27 |
| 2011/0140958 A1 | 6/2011 | Henkel et al. | | |
| 2012/0092213 A1* | 4/2012 | Chen | ...................... | G01S 19/44 342/26 A |
| 2013/0050024 A1* | 2/2013 | Barott | ................... | G01S 13/003 342/454 |
| 2014/0043188 A1* | 2/2014 | Desai | ...................... | G01S 19/20 342/357.58 |
| 2014/0292573 A1* | 10/2014 | Drescher | ................. | G01S 19/07 342/357.51 |
| 2015/0145722 A1* | 5/2015 | Johnson | ................. | G01S 19/07 342/357.44 |
| 2016/0146942 A1* | 5/2016 | McDonald | ............. | G01S 19/08 342/357.44 |

OTHER PUBLICATIONS

L. Sparks, A. Komjathy, and A. J. Mannucci, "Extreme Ionospheric Storms and Their impact on WAAS", (Herein referred as Sparks1 et al) 2005, pp. 1-9.*
Sparks et al "Multi-Cone Model for Estimating GPS Ionospheric Delays," pp. 24-25, Oct. 1, 2009.*
L. Sparks, "Kriging as a Means of Improving WAAS Availability" pp. 2013-2020, Sep. 2010.*
L. Sparks, A. Komjathy, and A. J. Mannucci, "Estimating Ionospheric Slant Delay without Resorting to the Thin-Shell Approximation" pp. 1-35, Apr. 25, 2006.*
PCT International Search Report and Written Opinion dated Dec. 9, 2013 for PCT Application No. PCT/US2013/049953.
Bilitza, D., et al., "International Reference Ionosphere 2007: Improvements and new parameters", Advances in Space Research, 42, 2008, 599-609.
Estey, Louis H., et al., "TEQC: The Multi-Purpose Toolkit for GPS/GLONASS Data", GPS Solutions, vol. 3, No. 1, pp. 42-49, 1999.
Hajj, George A., et al., "Ionospheric electron density profiles obtained with the Global Positioning System: Results from the GPS/MET experiment", Radio Science, vol. 33, No. 1, pp. 175-190, Jan.-Feb. 1998.
Hajj, G. A., et al., "Data assimilation of ground GPS total electron content into a physics-based ionospheric model by use of the Kalman filter", Radio Science, vol. 39, RS1S05, 2004.
Hernandez-Pajares, M., et al., "The IGS VTEC maps: a reliable source of ionospheric information since 1998", Journal of Geodesy (2009), 83:263-275.
Hwang, Cheinway, et al., "Quality assessment of FORMOSAT-3/COSMIC and GRACE GPS observables: analysis of multipath, ionospheric delay and phase residual in orbit determination", GPS Solutions, 14:121-131, 2010.
Jakowski, N., et al., "Space weather monitoring by GPS measurements on board CHAMP", Space Weather, (2007), vol. 5 (S08006).
Komjathy, A., et al., "JPL/USC GAIM: On the impact of using COSMIC and ground-based GPS measurements to estimate ionospheric parameters", Journal Geophysical Research, vol. 115, A02307, 2010.

Mandrake, L., et al., A performance evaluation of the operational Jet Propulsion Laboratory/University of Southern California Global Assimilation Ionospheric Model (JPL/USC GAIM), Journal Geophysical Research, vol. 110, A12306, 2005.
Mannucci, A. J., et al., "A global mapping technique for GPS-derived ionospheric total electron content measurements", Radio Science, vol. 33, No. 3, pp. 565-582, May-Jun. 1998.
Pi, Xiaoqing, et al., "Assimilative Modeling of Ionospheric Disturbances with FORMOSAT-3/COSMIC and ground-based GPS Measurements", Terr., Atmos., and Ocean. Sci., 20 (I), (2009), 273-285.
Sheeley, B. W., et al., "An empirical plasmasphere and trough density model: CRRES observations", Journal of Geophysical Research, vol. 106, No. A11, 25,631-25,641, Nov. 1, 2001.
Syndergaard, Stig, et al. "A Refractive Index Mapping Operator for Assimilation of Occultation Data", American Meteorological Society, Monthly Weather Review, vol. 133(9), pp. 2650-2668, 2005.
Tu, Jiannan., et al., "Empirical specification of field-aligned plasma density profiles for plasmasphere refilling", Journal of Geophysical Research (Space Physics), vol. 111, A06216, 2006.
Yizengaw, E., et al., "Global plasmaspheric TEC and its relative contribution to GPS TEC", Journal of Atmospheric and Solar-Terrestrial Physics, 70, 1541-1548, 2008.
Occultations—definition of Occultations by the Free Online Dictionary, (The American Heritage Dictionary of the English Language, 4th Edition copyright 2000 by Houghton Mifflin Company. Updated in 2009. Published by Houghton Mifflin Company.) http://www.thefreedictionary.com/Occultations.
TxDOT Survey Manual: Glossary. http://onlinemanuals.txdot.gov/txdotmanuals/ess/glossary.htm.
COSMIC : About Us, "FORMOSAT-3/COSMIC Overview", UCAR Community Programs, last modified Jan. 29, 2013. http://www.cosmic.ucar.edu/about.html.
"Radio occultation", Wikipedia, the free encyclopedia, Planetary science, Physics stubs, last modified on Aug. 29, 2012. http://en.wikipedia.org/wiki/Radio_occultation.
"Ionosphere", Wikipedia, the free encyclopedia, Radio frequency propagation, Atmosphere, Space plasmas, Plasma physics, last modified Jan. 28, 2013. http://en.wikipedia.org/wiki/Ionosphere.
"Algorithm Description Document for the Grid Ionospheric Vertical Error (GIVE) Monitor of the Wide Area Augmentation System", CDRL Sequence No. A014-006H, prepared for the Federal Aviation Administration by the Raytheon Company, Jul. 14, 2010, Parts A, B, C, D (454 pages).
Altshuler, E. S., et al., "The WAAS Ionospheric Spatial Threat Model," Proc. of Ion GPS 2001, Institute of Navigation, Salt Lake City, UT, Sep. 11-14, 2001, pp. 2463-2467.
Blanch, J., "An Ionosphere Estimation Algorithm for WAAS Based on Kriging", Proceedings of the 15th International Technical Meeting of the Satellite Division of the Institute of Navigation (ION GPS 2002), Portland, OR, Sep. 24-27, 2002, pp. 816-823.
Blanch, J. (2003), Using Kriging to Bound Satellite Ranging Errors Due to the Ionosphere, Ph.D. thesis, Stanford University, Stanford, California (available online at waas.stanford.edu), 148 pages.
Komjathy, A., et al., (2005), The ionospheric impact of the Oct. 2003 storm event on Wide Area Augmentation System, GPS Solutions, 9, pp. 41-50, doi:10.1007/s10291-004-0126-2.
Paredes, E., et al., "Reconstructing the WAAS Undersampled Ionospheric Gradient Threat Model for the WAAS Expansion into Mexico," in Proceedings of the 21st International Technical Meeting of the Satellite Division of the Institute of Navigation (ION GNSS 2008), Savannah, GA, Sep. 2008, pp. 1938-1947.
Sparks, L., et al., "The WAAS Ionospheric Threat Model," Proc. of the International Beacon Satellite Symposium 2001, Boston, MA, Jun. 2001, 5 pages.
Sparks, L., et al., "Sudden Ionospheric Delay Decorrelation and Its Impact on the Wide Area Augmentation System (WAAS)", Radio Sci., 39, RS1S13, 2004, 13 pages. doi:10.1029/2002RS002845.
Sparks, L. A., et al., "SBAS Estimation of Ionospheric Delay in the Presence of a Highly Structured Ionosphere," Proceedings of the Beacon Satellite Symposium 2004, Trieste, Italy, Oct. 2004, 22 pages.

(56) References Cited

OTHER PUBLICATIONS

Sparks, L., et al., "Extreme Ionospheric Storms and Their Impact on WAAS", Proc. of the 11th International Ionospheric Effects Symposium 2005 (IES 2005), Alexandria, VA, May 2005, pp. 1-9. http://hdl.handle.net/2014/37807.

Sparks, L., et al., "Estimating Ionospheric Slant Delay without Resorting to the Thin-Shell Approximation", JPL, Position Location and Navigation Symposium 2006, San Diego, CA, Apr. 25, 2006, 35 pages.

Sparks, L., et al., "Validation of the Computation of the WAAS Ionospheric Threat Model—Final Report on the Intercode Comparison for Release 8/9", delivered to the WAAS Integrity and Performance Panel (WIPP), Oct. 1, 2008, 11 pages.

Sparks, L. A., et al., "Conical-Domain Model for Estimating GPS Ionospheric Delays," Software Tech Briefs, Supplement to NASA Tech Briefs, Sep. 4, 2009A, pp. 18-19.

Sparks, L. A., et al., "Multi-Cone Model for Estimating GPS Ionospheric Delays," NASA Tech Briefs, Oct. 1, 2009B, pp. 24-25.

Sparks, L., et al., "Kriging as a Means of Improving WAAS Availability", Proceedings of the 23rd International Technical Meeting of the Satellite Division of the Institute of Navigation (ION GNSS 2010), Portland, OR, Sep. 21-24, 2010, pp. 2013-2020.

Sparks, L., et al. (2010a), Estimation of Ionospheric Delay Using Kriging and its Impact on WAAS Availability, Proceedings of the International Beacon Satellite Symposium 2010, Technical University of Catalonia, Barcelona, Spain, 20 pages.

Sparks, L., et al. (2010b), Kriging as a Means of Improving WAAS Availability, Proceedings of the 23rd International Technical Meeting of the Satellite Division of the Institute of Navigation (ION GNSS 2010), Portland, OR, pp. 2013-2020.

Sparks, L., et al., "Estimating ionospheric delay using kriging: 1. Methodology", Radio Science—Washington—, 46, 6, 2011, RS0D21, 35 pages. doi:10.1029/2011RS004667.

Sparks, L., et al., "Estimating ionospheric delay using kriging: 2. Impact on satellite-based augmentation system availability", Radio Science, vol. 46, Issue 6, Dec. 2011, RS0D22, 28 pages. doi:10.1029/2011RS004781.

Sparks, L. (2013), Ionospheric Slant TEC Analysis Using GNSS-based Estimation (IonoSTAGE), JPL-D 34117, Jet Propulsion Laboratory, Pasadena, CA, 144 pages.

Walter, T., et al., "Robust Detection of Ionospheric Irregularities", Navigation, Journal of the Institute of Navigation, vol. 48, No. 2, Summer 2001, pp. 89-100.

Zumberge, J. F., et al., (1997), Precise point positioning for the efficient and robust analysis of GPS data from large networks, J. Geophys. Res., 102 (B3), pp. 5005-5017.

\* cited by examiner

IONOSPHERIC SLANT TOTAL ELECTRON CONTENT ANALYSIS USING GLOBAL POSITIONING SYSTEM BASED ESTIMATION

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/670,731, filed on Jul. 12, 2012, by Lawrence C. Sparks, entitled "Ionospheric Slant TEC Analysis Using GPS-Based Estimation (IonoSTAGE),"; and Provisional Application Ser. No. 61/837,442, filed on Jun. 20, 2013, by Lawrence C. Sparks, Anthony J. Mannucci, and Attila Komjathy, entitled "Eliminating Obliquity Error From the Estimation of Ionospheric Delay In a Satellite-Based Augmentation System,".

This application is related to the following co-pending and commonly-assigned patent application, which application is incorporated by reference herein:

U.S. patent application Ser. No. 13/763,196, filed on Feb. 8, 2013, now U.S. Pat. No. 9,255,993, issued on Feb. 9, 2016, by Philip John Stephens, Attila Komjathy, Brian D. Wilson, and Anthony J. Mannucci, entitled "Processing Satellite Data for Slant Total Electron Content Measurements,", which application/patent claims priority to Provisional Application Ser. No. 61/596,406, filed on Feb. 8, 2012, by Philip Stephens, Attila Komjathy, Brian D. Wilson, and Anthony J. Mannucci, entitled "Processing COSMIC/FORMOSAT-3 Data for Slant Total Electron Content Measurements,".

STATEMENT REGARDING FEDERALLY SPONSORED RESEARCH AND DEVELOPMENT

The invention described herein was made in the performance of work under NASA Contract, and is subject to the provisions of Public Law 96-517 (35 USC 202) in which the Contractor has elected to retain title.

BACKGROUND OF THE INVENTION

1. Field of the Invention

The present invention relates generally to ionospheric modeling, and in particular, to a method, apparatus, and article of manufacture for analyzing ionospheric slant total electron content (TEC) using global positioning system (GPS) based estimation.

2. Description of the Related Art (Note: This application may reference a number of different publications as indicated throughout the specification. A list of these different publications as well as references that may be relevant to the present invention can be found below in the section entitled "References." Each of these publications is incorporated by reference herein.)

For single-frequency users of global navigation satellite systems (GNSS), ionospheric delay continues to be the largest source of positioning error. In this regard, free electrons along the raypath impede the passage of a GNSS signal through the ionosphere. The total delay is proportional to the slant total electron content (STEC) along the raypath. The issue arises regarding how to analyze and visualize ionospheric STEC using measurements of GNSS. To understand such issues better, a description of prior art position estimating systems may be useful.

To guarantee the safety of airline navigation based upon GNSS signals, satellite-based augmentation systems (SBAS) have been developed to ensure the accuracy, integrity, availability, and continuity of user position estimates derived from GNSS measurements. In the United States, the Wide Area Augmentation System (WAAS) is an augmentation of the Global Positioning System (GPS) that measures the ionospheric slant delay of signals propagating from GPS satellites to multiple, dual frequency receivers distributed across North America in a network of thirty-eight reference stations (see FIG. 1).

To allow the user to correct for the error due to ionospheric delay, WAAS derives from these measurements a vertical delay estimate at each ionospheric grid point (IGP) in a mask specified by the WAAS Minimum Operational Performance Standards [MOPS, 2001] (see FIG. 2). The vertical delay at an IGP is designated the Ionospheric Grid Delay (IGD) at that IGP. In addition, WAAS computes, at each IGP, a safety-critical integrity bound called the Grid Ionospheric Vertical Error (GIVE). Integrity refers to the reliability and trustworthiness of the information provided by the navigation system and to the system's ability to deliver timely warnings to users when the system should not be used for navigation because of signal corruption or some other error or failure in the system. GIVEs are derived from inflated and augmented values of the formal estimation error. They protect the user from the effects of delay estimation error due to ionospheric irregularity, both sampled and undersampled.

From the Initial Operating Capability of WAAS in July of 2003 through Release 8/9 of the initial system to newer systems, the vertical delay estimate and its integrity bound at each IGP have been calculated from a planar fit of slant delay measurements projected to vertical. The slant-to-vertical conversion is achieved by modeling the ionosphere as an infinitesimally thin shell at a representative ionospheric altitude (see FIG. 3). In a later version of WAAS, estimation of vertical delays is performed by a geo-statistical technique known as kriging [Cressie, 1993; Webster, 2001; Blanch, 2002; Wackernagel, 2003], a type of minimum mean square estimator, adapted to spatial data, that originated in the mining industry in the 1950's. Kriging provides a smoothed depiction of a spatially distributed variable that has been sampled by irregularly spaced measurements. Compared to the planar fit model, the kriging model generally achieves a better match to the observed random structure of the vertical delays (or it can be tuned to match these data better).

To calculate the IGDs and GIVEs, WAAS (as well as the European Geostationary Navigation Overlay Service [EGNOS]) models the ionosphere as an infinitesimally thin shell at a representative ionospheric altitude (referred to as the thin shell model). The thin shell model is a crude model where the electron density is assumed to be non-negligible only in an infinitesimally thin layer located at a shell height representative of the altitude where the electron density attains its peak value. Such a crude approximation necessarily introduces error into delay estimation.

The thin shell model serves two purposes: (1) to define the ionospheric pierce point (IPP) of each measurement; and (2) to convert the slant delay measurement to a vertical delay estimate at the IPP. An IPP is the location where a satellite-to-station raypath or a satellite-to-user-receiver raypath penetrates the thin shell. At regularly spaced intervals in time, WAAS performs delay estimation, converting slant delay measurements in a given epoch to vertical delay estimates and transforms these vertical delay estimates, distributed unevenly in space over the thin shell, into a set of vertical delay estimates distributed at regular spatial intervals on the WAAS ionospheric grid. To infer the ionospheric slant delay (and its integrity bound) associated with a GPS signal detected by the user's receiver, the user must first determine the IPP associated with the signal and then approximate the vertical delay at this IPP using bilinear interpolation of the IGDs (and their integrity bounds) at the nearest IGPs surrounding the IPP. The interpolated vertical delay estimate is then converted, again using the thin shell model, to an estimate of the slant delay from the satellite to the user.

With a slant delay estimate and integrity bound for each GPS signal detected by a user's receiver, the user can determine a correction to his or her position estimate and an integrity bound on that estimate. This integrity bound is used, in turn, to specify the user's Horizontal Protection Level (HPL) and Vertical Protection Level (VPL). The HPL and VPL are the receiver-computed integrity bounds defined by the MOPS [2001] as, respectively, the radius of a circle in the horizontal plane and the half-length of a segment on the vertical axis perpendicular to this plane, each describing a region whose center coincides with the user's true position and whose breadth is sufficient to provide assurance that the region contains the estimated position. The HPL and VPL define the regions in which the respective time-to-alert requirements can be met. A Horizontal Alert Limit (HAL) and, where applicable, a Vertical Alert Limit (VAL) are associated with each navigation mode (e.g., precision approach, non-precision approach, en route, etc.) supported by WAAS. The MOPS [2001] defines the HAL and VAL as, respectively, a radius and segment half-length, analogous to the HPL and VPL, each describing regions also centered on the user's position but of such breadth as to meet the requirement to contain the true position within the probability required for a particular navigation mode. When the HPL exceeds the HAL or the VPL exceeds the VAL for a given level of aviation service, that level of service is not available to the user. When the true error in a user's position exceeds the VAL (for equipment aware of the navigation mode) or the computed VPL (for equipment not aware) and WAAS fails to provide notification of the error within the time-to-alert of the applicable phase of flight, WAAS is considered to be broadcasting hazardously misleading information (HMI). For example, the most restrictive integrity requirement on WAAS is that the upper bound on the probability of broadcasting hazardously misleading information be no more than one occurrence in every 10,000,000 runway approaches (resulting in either landings or missed approaches) that use precision approach with vertical guidance, i.e., a probability of broadcasting hazardously misleading information of $10^{-7}$.

By this means, WAAS provides vertical guidance down to a minimum height above the runway as determined by the level of the aviation service. The decision height in a precision approach is the height at which a missed approach must be initiated if the required visual reference to continue the approach has not been established. Each level of aviation service specifies a distinct decision height and VAL. For Localizes Performance with Vertical guidance (LPV) service, the decision height is 250 feet and the VAL is 50 meters; for LPV200 service, the decision height is 200 feet, and the VAL is 35 meters.

As described above, in its initial operational capability, WAAS performed vertical delay estimation by incorporating the thin shell model into a planar fit algorithm. A later version of WAAS replaced the planar fit algorithm with an algorithm based upon a geo-statistical technique known as kriging. The success of kriging is partly due to its ability to mitigate the error due to the thin shell approximation. Other alternative methods of delay estimation eliminate the need for adopting the thin shell approximation altogether.

However, even though WAAS and other systems are capable of performing delay estimation, such prior methods fail to provide a delay estimation method that is efficient and sufficiently removes one or more sources of error. Regardless of the method utilized to mitigate error, it is useful to have a system that allows the user to analyze and visualize the ionospheric STEC using GNSS. In other words, it is useful to have a system that measures/evaluates the accuracy of the method utilized and determine STEC.

SUMMARY OF THE INVENTION

Embodiments of the invention provide three fundamental capabilities: (1) estimation of ionospheric slant TEC along arbitrary raypaths, based upon fits of historical GNSS data that are used to define the state of the ionosphere; (2) calculation of the ionospheric threat model for the Wide Area Augmentation System (WAAS) of the Federal Aviation Administration (FAA); and (3) calculation of the Ionospheric Grid Delay (IGD) and the Grid Ionospheric Vertical Error (GIVE) that are broadcast by WAAS for a given set of observational data. In addition, embodiments of the invention contain various scripts that serve as tools for analyzing the behavior of ionospheric TEC and for optimizing performance of satellite-based augmentation systems.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and, by way of illustration, several embodiments of the present invention are shown. It is understood that other embodiments may be utilized and structural changes may be made without departing from the scope of the present invention.

Hardware Environment

Figure 1:
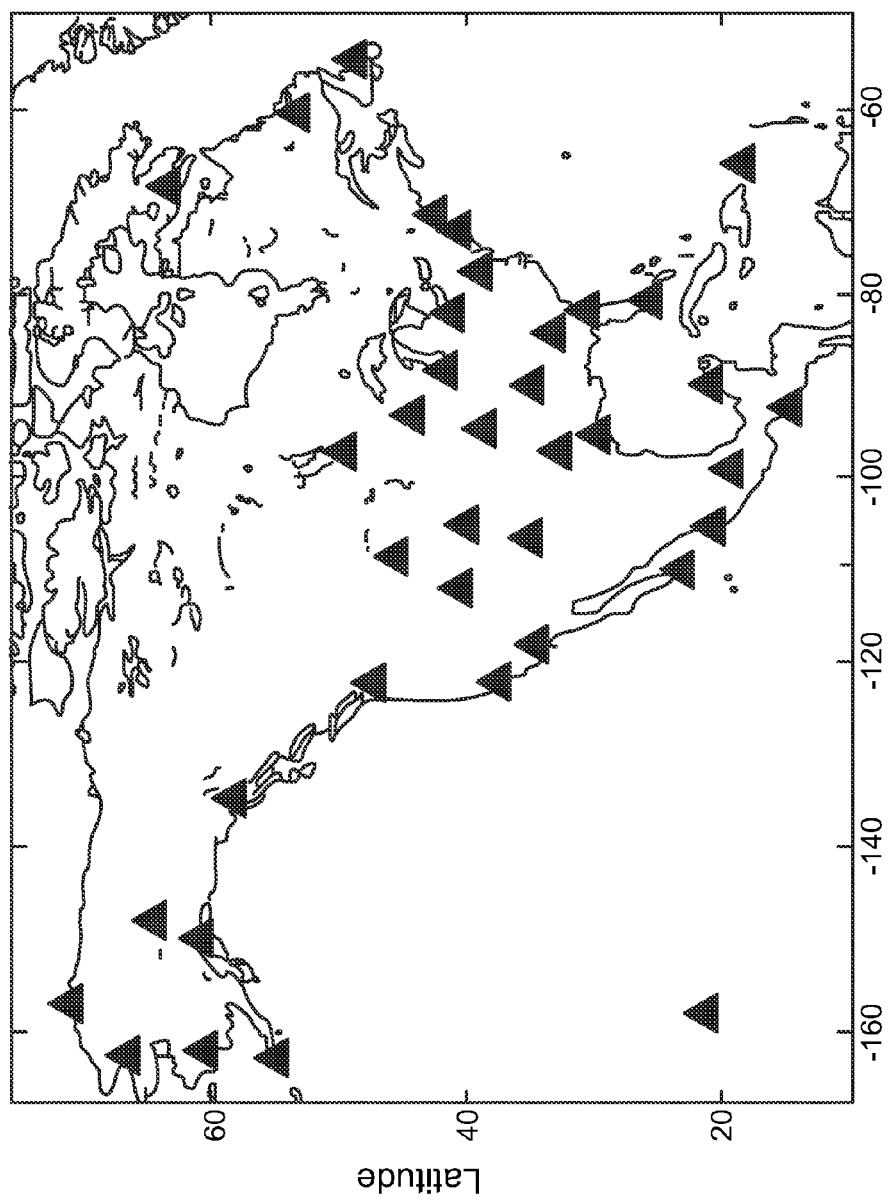
FIG. 1 shows the locations of receiver sites in the Wide Area Augmentation System (WAAS)
Figure 2:
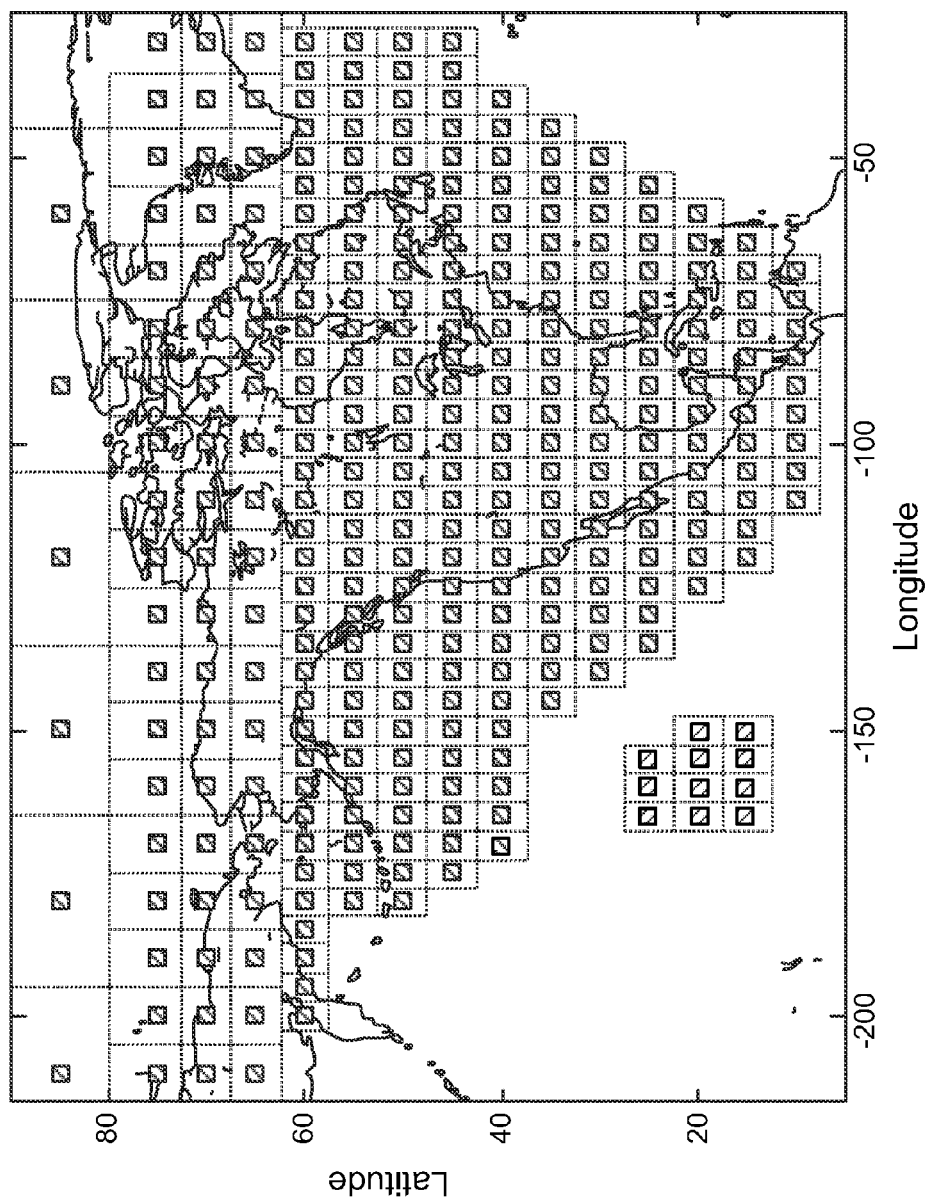
FIG. 2 illustrates the IGP mask specified by the WAAS Minimum Operational Performance Standards.
Figure 3:
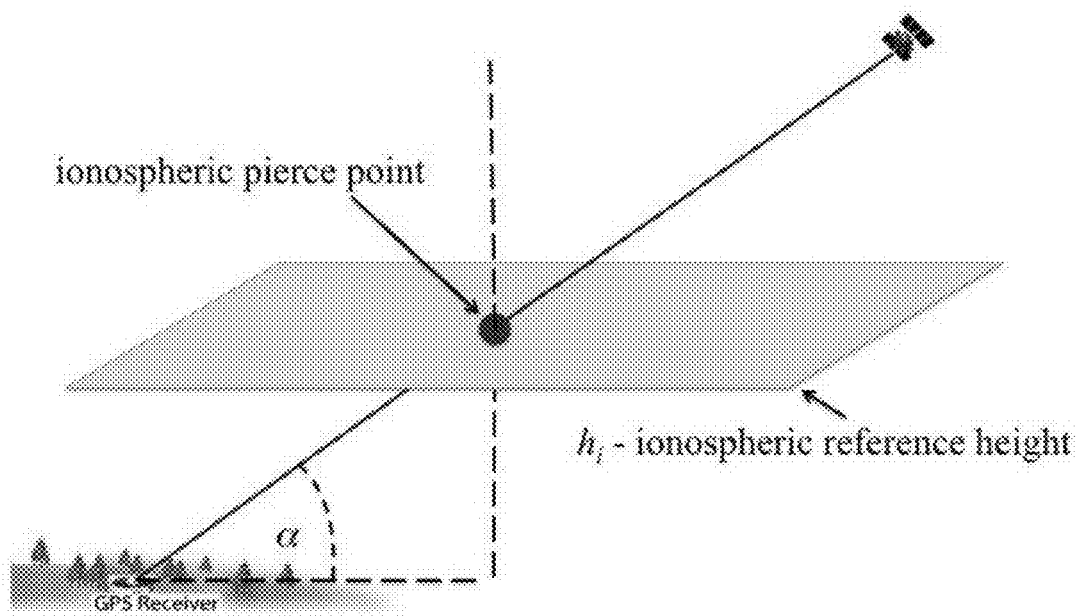
FIG. 3 illustrates a slant-to-vertical conversion that is achieved by modeling the ionosphere as an infinitesimally thin shell at a representative ionospheric altitude.
Figure 4:
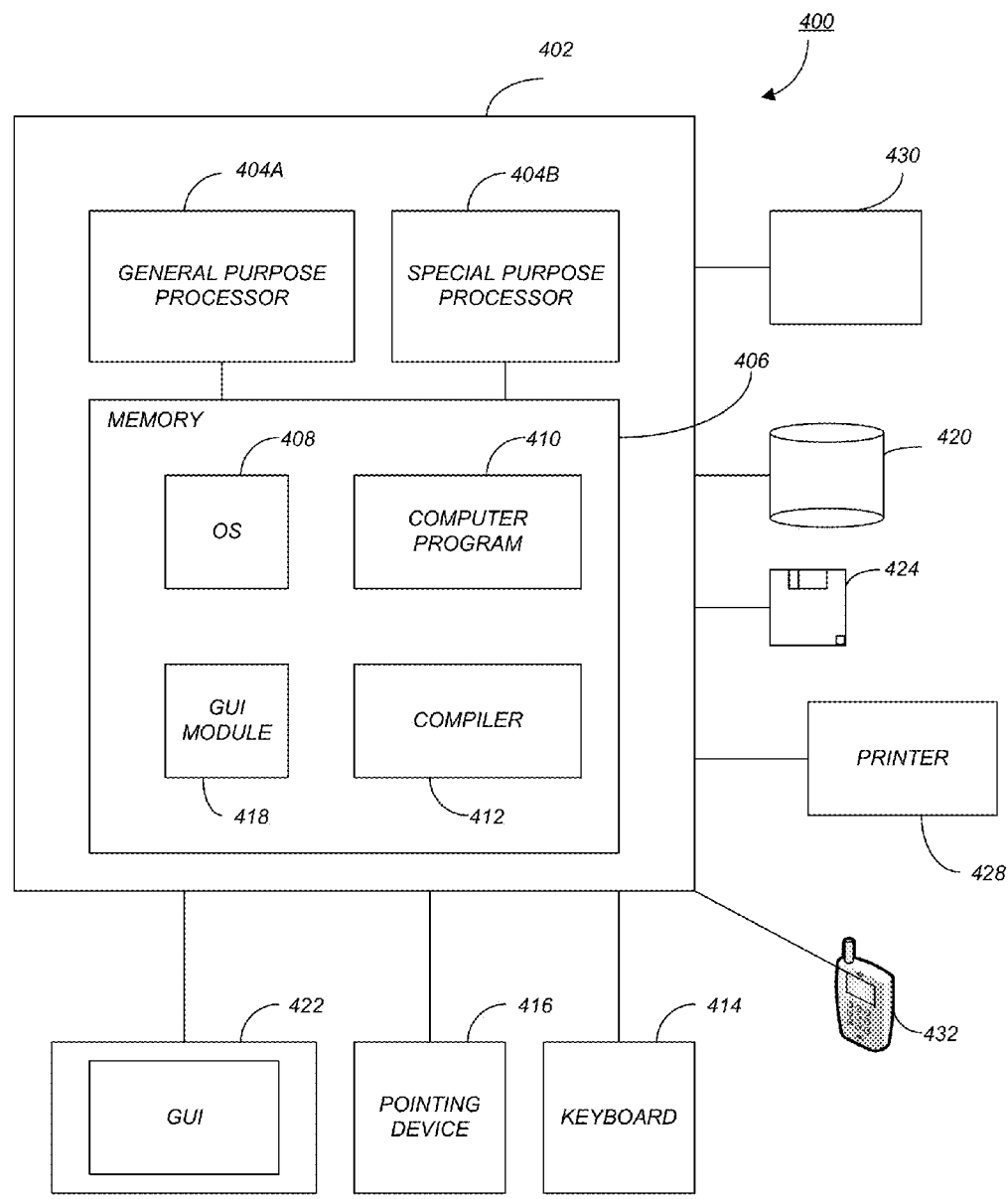
FIG. 4 is an exemplary hardware and software environment used to implement one or more embodiments of the invention.

FIG. 4 is an exemplary hardware and software environment 400 used to implement one or more embodiments of the invention. The hardware and software environment includes a computer 402 and may include peripherals. Computer 402 may be a user/client computer, server computer, or may be a database computer. The computer 402 comprises a general purpose hardware processor 404A and/or a special purpose hardware processor 404B (hereinafter alternatively collectively referred to as processor 404) and a memory 406, such as random access memory (RAM). The computer 402 may be coupled to, and/or integrated with, other devices, including input/output (I/O) devices such as a keyboard 414, a cursor control device 416 (e.g., a mouse, a pointing device, pen and tablet, touch screen, multi-touch device, etc.) and a printer 428. In one or more embodiments, computer 402 may be coupled to, or may comprise, a portable or media viewing/listening device 432 (e.g., an MP3 player, iPod™, Nook™, portable digital video player, cellular device, personal digital assistant, etc.). In yet another embodiment, the computer 402 may comprise a multi-touch device, mobile phone, gaming system, internet enabled television, television set top box, or other internet enabled device executing on various platforms and operating systems.

In one embodiment, the computer 402 operates by the general purpose processor 404A performing instructions defined by the computer program 410 under control of an operating system 408. The computer program 410 and/or the operating system 408 may be stored in the memory 406 and may interface with the user and/or other devices to accept input and commands and, based on such input and commands and the instructions defined by the computer program 410 and operating system 408, to provide output and results.

Output/results may be presented on the display 422 or provided to another device for presentation or further processing or action. In one embodiment, the display 422 comprises a liquid crystal display (LCD) having a plurality of separately addressable liquid crystals. Alternatively, the display 422 may comprise a light emitting diode (LED) display having clusters of red, green and blue diodes driven together to form full-color pixels. Each liquid crystal or pixel of the display 422 changes to an opaque or translucent state to form a part of the image on the display in response to the data or information generated by the processor 404 from the application of the instructions of the computer program 410 and/or operating system 408 to the input and commands. The image may be provided through a graphical user interface (GUI) module 418. Although the GUI module 418 is depicted as a separate module, the instructions performing the GUI functions can be resident or distributed in the operating system 408, the computer program 410, or implemented with special purpose memory and processors.

In one or more embodiments, the display 422 is integrated with/into the computer 402 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 402 according to the computer program 410 instructions may be implemented in a special purpose processor 404B. In this embodiment, the some or all of the computer program 410 instructions may be implemented via firmware instructions stored in a read only memory (ROM), a programmable read only memory (PROM) or flash memory within the special purpose processor 404B or in memory 406. The special purpose processor 404B may also be hardwired through circuit design to perform some or all of the operations to implement the present invention. Further, the special purpose processor 404B may be a hybrid processor, which includes dedicated circuitry for performing a subset of functions, and other circuits for performing more general functions such as responding to computer program 410 instructions. In one embodiment, the special purpose processor 404B is an application specific integrated circuit (ASIC).

The computer 402 may also implement a compiler 412 that allows an application or computer program 410 written in a programming language such as COBOL, Pascal, C++, FORTRAN, or other language to be translated into processor 404 readable code. Alternatively, the compiler 412 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 410 accesses and manipulates data accepted from I/O devices and stored in the memory 406 of the computer 402 using the relationships and logic that were generated using the compiler 412.

The computer 402 also optionally comprises an external communication device such as a modem, satellite link, Ethernet card, or other device for accepting input from, and providing output to, other computers 402.

In one embodiment, instructions implementing the operating system 408, the computer program 410, and the compiler 412 are tangibly embodied in a non-transient computer-readable medium, e.g., data storage device 420, which could include one or more fixed or removable data storage devices, such as a zip drive, floppy disc drive 424, hard drive, CD-ROM drive, tape drive, etc. Further, the operating system 408 and the computer program 410 are comprised of computer program 410 instructions which, when accessed, read and executed by the computer 402, cause the computer 402 to perform the steps necessary to implement and/or use the present invention or to load the program of instructions into a memory 406, thus creating a special purpose data structure causing the computer 402 to operate as a specially programmed computer executing the method steps described herein. Computer program 410 and/or operating instructions may also be tangibly embodied in memory 406 and/or data communications devices 430, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 402.

As described above, embodiments of the invention may be installed as a computer/software application 410 (that may also be referred to as IonoSTAGE™) executing on computer 400. More specifically, embodiments of the invention may be implemented in a numerical computing environment such as MATLAB™ (matrix laboratory) that allows matrix manipulations, plotting of functions and data, implementation of algorithms, creation of user interfaces, and interfacing with programs written in other languages (e.g., C, C++, Java™, and Fortran™).

To initialize the software application 410, a script may be executed that identifies a default graphics device and enables searching to be performed in a working directory, a directory containing the source code, and a directory storing observational data (e.g., supertruth data) (e.g., that were obtained from GNSS systems)

Estimation of Total Electron Content (TEC)

Embodiments of the invention estimate slant TEC for a given set of raypath geometries by fitting historical data to a specified model. Estimation may be performed at fit centers that are actual ionospheric grid points (IGPs) or pseudo-IGPs (i.e., measurement ionospheric pierce points [IPPs] treated as IGPs). The data used to specify the state of the ionosphere may be the same as, or distinct from, the data used to specify the estimate raypath geometry. The delay estimation models that may be invoked are as follows:

1. planar fit model—a model in which the ionosphere is collapsed into a thin shell at a fixed reference height (typically 350 km). Planar fit estimation is performed on slant delays converted to vertical using the thin shell obliquity factor (see Sparks et al., 2011A).
2. kriging model—a model also based upon the thin shell model but with measurements near the fit center weighted more heavily than those far from the fit center (see Sparks et al., 2011A).
3. conical domain model—a model in which receiver and satellite positions define a set of cones with satellite positions at the vertices. Each estimation is performed using measurements associated with only a single satellite (see Sparks et al., 2009A).
4. multi-cone model—a two-phase estimation scheme where, in the first phase, the conical-domain model is used to obtain an estimate of the slant delay for each ray path that connects a visible satellite to a specified earth point, and, in the second phase, the conical domain model is inverted to perform delay estimation using cones of pseudo-measurements, each with a single receiver at the vertex (see Sparks et al., 2009B).
5. weighted average—an estimation scheme where each measurement in a given fit is weighted according the distance of its ionospheric pierce point from the fit center, raised to a specified power. This model has been used primarily for diagnostic purposes.

In embodiments of the invention, the computation of slant TEC estimates may be separated into three stages. An additional stage is required when using the multi-cone model (see Sparks, 2008). Associated with each stage is a distinct set of one or more output files in mat format. Decomposing the problem in this manner facilitates the development of diagnostic tools. Each stage of the calculation can be analyzed by examining its output.

Figure 5:
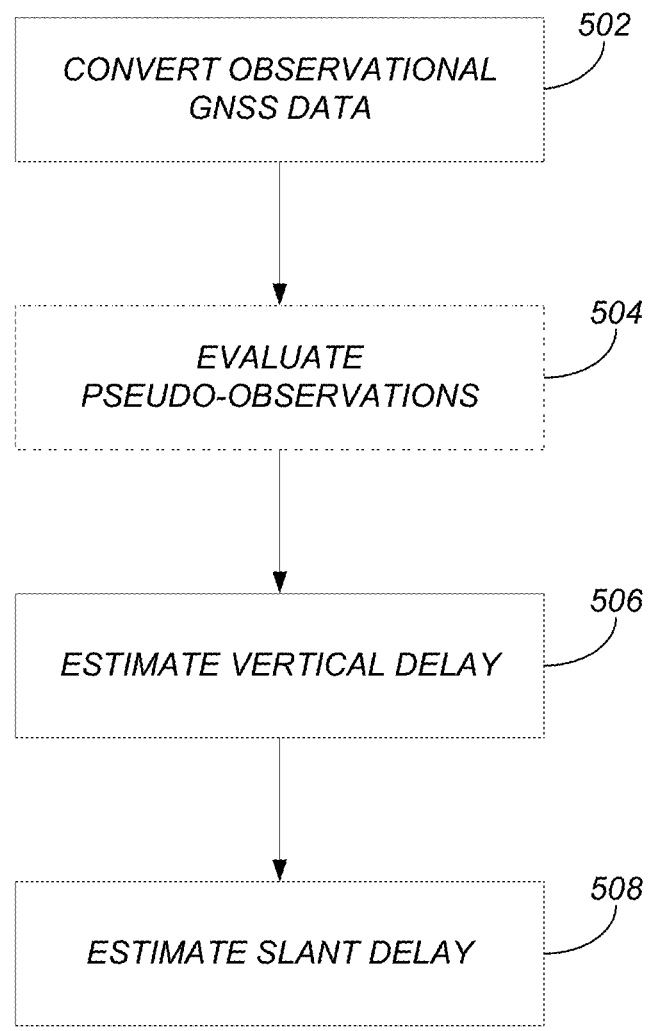
FIG. 5 illustrates the stages used to calculate TEC estimates in accordance with one or more delay estimation models used in the invention.

FIG. 5 illustrates the stages used to calculate TEC estimates in accordance with one or more embodiments of the invention. As described above, four steps are utilized with a multi-cone model (the second stage/step [e.g., step 504] is omitted when using any of the other models). Each step is associated with a distinct script and a distinct set of output files.

At step 502, observational GNSS data are converted from a first format into a second format (e.g., from American Standard Code for Information Interchange [ASCII] [also referred to as supertruth]) format is converted into mat format. In addition to performing various conversions, step 502 may smooth and decimate the ASCII data. Step 502 writes various data arrays, on a day-by-day or hour-by-hour basis, to observed delay data mat files.

At step 504, the conical domain approach is used to evaluate pseudo-observations corresponding to raypaths that link satellites to target points. Each conical domain fit is performed with a satellite at the cone vertex and a target point serving as the fit center whose location restricts the measurements to be included in the fit. Step 504 outputs pseudo-observations that are subsequently written to epoch pseudo-observation data mat files on an epoch-by-epoch basis. Further, step 504 includes writing an epoch pseudo-observation summary mat file that contains variables describing the pseudo-observational data and options used to perform pseudo-delay estimation. Note: this step is omitted when a delay estimation model other than the multi-cone model is selected.

At step 506, the vertical delay is estimated (e.g., at the IPPs of the observations to be modeled), by fitting actual (or synthetic) GNSS data to a delay model (i.e., a specified delay model) (e.g., over an extended geographic region). Optionally, when using the planar fit model, this function may simply evaluate model parameters and their covariances that may be later used to estimate vertical delay. As an additional option, data-deprivation may be invoked, i.e., using IPP masks to remove (from each fit) a specified portion of the fit IPPs. The estimating results in fit data that are written to epoch delay fit data mat files on an epoch-by-epoch basis. Vertical delay estimates are written to epoch equivalent vertical delay (EVD) data mat files on an epoch-by-epoch basis. Epoch delay fit data files and epoch EVD data files reside in fit directories, each associated with a specified time interval. For each fit directory, an epoch delay fit summary mat file is written that contains variables describing the observational data and options used to perform delay estimation over the time interval associated with that directory.

At step 508, the slant delay is estimated for given sets of raypath geometries by fitting historical (GNSS) data to a specified delay model over a specified set of time durations. The fitting results in a summary of the slant delay that is written to a delay estimation summary file in a primary output directory. The delay estimation summary file stores a summary of all input data options, all processing options, and a record of all delay estimate output directories. Each delay estimate directory contains epoch delay estimate data mat files storing delay estimates on an epoch-by-epoch basis over a specified time interval. Each delay estimate directory also contains an epoch estimate summary mat file that contains variables describing the output delay estimates stored in the directory and the options used to generate them over the specified time interval.

The vertical delay estimation discussed in step 506 can be performed in a variety of ways, depending on the type of fit center selected. Options are as follows:

1. GEO_IPP—evaluate the vertical delay at an IPP using the IPP as the fit center;
2. INCLUSIVE_FIT_IPP—evaluate the vertical delay at an IPP using the nearest fit IPP as the fit center, keeping the IPP in the estimation if it is the fit center IPP;

3. EXCLUSIVE_FIT_IPP—evaluate the vertical delay at an IPP using the nearest fit IPP as the fit center, excluding the IPP from the estimation if it is the fit center IPP;
4. ADJACENT_IGP—evaluate the vertical delay at an IPP using the IGP nearest the IPP as the fit center, keeping the IPP in the estimation if it is a fit IPP;
5. EXCLUSIVE_IGP—evaluate the vertical delay at an IPP using the IGP nearest the IPP as the fit center, excluding the IPP from the estimation if it is a fit IPP;
6. INTERPOLATED_IGP—evaluate the vertical delay at an IPP by interpolating vertical delays estimated at fit center IGPs located at the vertices of the cell in which the IPP resides; and
7. WEIGHTED_IGP—evaluate the vertical delay at an IPP by a weighted average of estimates at the IPP using fit center IGPs located at the vertices of the cell in which the IPP resides.

To estimate the vertical delay at a set of ionospheric grid points, as well as to evaluate slant delay estimates, various scripts may be utilized. When the observational data used to specify the state of the ionosphere are distinct from the observational data used to specify the estimate raypath geometries, embodiments of the invention may, by default, calculate slant delay by using the WAAS algorithm to interpolate vertical delay, both spatially and temporarily, at the grid points of the corners of the grid cell in which the user's IPP resides. The interpolated vertical delay is converted to slant delay using the usual thin shell model obliquity factor.

Delay Model Accuracy Analysis

When the observational data used to specify the state of the ionosphere are the same as the data used to specify the estimate raypath geometry, vertical delay estimates can be evaluated at IPPs associated with actual observations. These vertical delays can be converted to slant in the manner described above. For each estimated delay, the observed delay is known. This capability permits embodiments of the invention to assess the accuracy of estimated delays.

To evaluate the accuracy of a delay model, a script may be executed that calculates delay estimate residuals and plots various figures showing their behavior. Optionally, results generated by two distinct delay models can be compared.

The calculation and analysis of TEC residuals (estimated TEC—observed TEC) have been separated into two stages, each stage with its distinct set of one or more output files in mat format. Again, decomposing the problem in this fashion facilitates the development of diagnostic tools. An additional advantage of this decomposition of the problem is that it can provide for efficient recomputation of the TEC estimatation error when new options are invoked. Each stage is associated with a distinct script and a distinct set of output files.

Stage 1—Bin Delay Residuals

The first stage tabulates residual differences between (observed) slant delay measurements (that have been projected to vertical), and the corresponding estimated slant TEC delay (based on the specified delay model). It outputs bin matrices for specified data durations in delay residual bin data files. When two models are to be compared, the stage tabulates comparisons of two sets of delay residuals and outputs the results to two-model delay residual bin data files.

Stage 2—Analyze Delay Model Accuracy

The second stage writes a delay model accuracy summary mat file that contains variables specifying the delay model (or the delay models to be compared), the options used to generate delay estimates (i.e., the estimated slant TEC delay estimates), and access to all the output generated by the run. This stage may also plot results.

Ionospheric Threat Model Computation

This section presents an overview of the computation of an ionospheric threat model [Sparks et al., 2001, Altshuler et al., 2001, Paredes et al., 2008, GIVE ADD, 2010, Sparks et al., 2011A, 2011B]. However, this section first describes how to simply generate an ionospheric threat model Quickstart Guide to Creating the WAAS Ionospheric Threat Model To create a spatial-temporal ionospheric threat model, users must first download the required ASCII supertruth files from a storage location (e.g., a Stanford™ web server) and place the files in a data directory. A list of such files needed to compute the WFO Release 3 threat model appears in Sparks et al., 2011. The user can subsequently generate the WFO Release 3 threat model by executing a command in a Matlab™ session (e.g., create_iono_threat_model (WFO_v3');).

Such a command initiates a very lengthy computation that generates and merges two component threat models that constitute the WFO Release 3 threat model, namely, the WAAS-only and WAAS+Mexico components. Such a process may take up to eight days to complete.

Overview of a Threat Model Computation

The ionospheric threat model consists of a table of $\sigma_{undersampled}$ values [Sparks et al., 2011B]. In embodiments of the invention, the computation of a single threat model has been separated into eight stages (a ninth stage is required to merge the components of a multi-component threat model, e.g., components based upon WAAS-only data and WAAS+Mexico data). Associated with each stage is a distinct set of one or more output files in ASCII or mat format. The advantages of this decomposition of the problem are similar to those discussed in the decomposition of the computation of TEC estimate residual error: facilitating the development of diagnostic tools and providing for efficient recomputation of the threat model whenever new options are invoked.

For example, if the user wishes to calculate a threat model using a different threat model metric, only those stages of the computation affected by the option change need be recalculated, i.e., the binning of threat model error must be recomputed but not the fitting of GNSS observations at IGPs nor the estimation of model delays based upon these fits. This represents a potentially enormous savings in computational time and resources.

Figure 6:
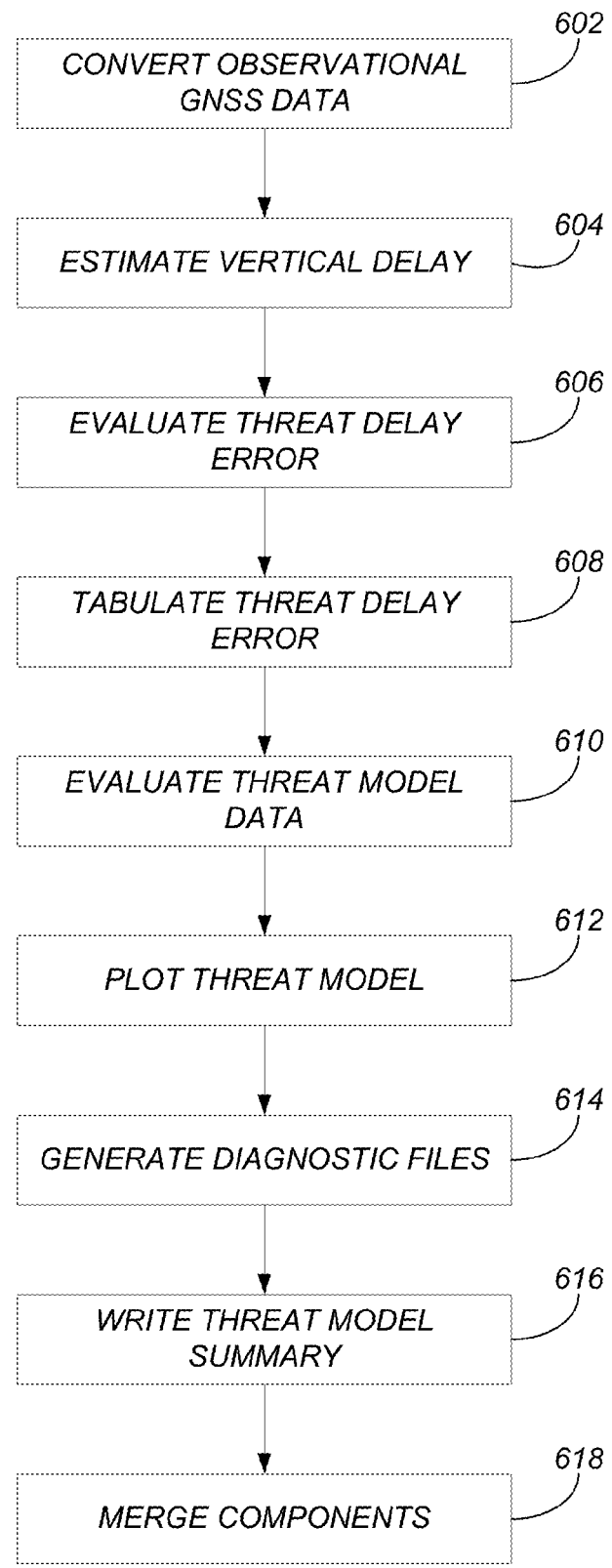
FIG. 6 illustrates the nine steps in the calculation of the WAAS ionospheric (spatial-temporal) threat model, involving two components that are merged in accordance with one or more embodiments of the invention.

FIG. 6 illustrates the nine steps in the calculation of the WAAS ionospheric (spatial-temporal) threat model, involving two components that are merged in accordance with one or more embodiments of the invention. Each step is associated with a distinct script:

At step 602, observational GNSS data are converted from a first format into a second format (e.g., in ASCII [supertruth] format to mat format). In addition to performing various conversions, this step smoothes and decimates the ASCII data. It writes various data arrays, on a day-by-day or hour-by-hour basis, to observed delay data mat files.

At step 604, vertical delay of the observational GNSS data (at the IPPs of the observations to be modeled) is estimated by fitting actual observational GNSS data to a specified delay model over an extended geographic region. Multiple vertical delay estimates at the same IPP are evaluated using different data deprivation masks. Fit data are written to epoch delay fit data mat files on an epoch-by-epoch basis. Vertical delay estimates are written to epoch equivalent vertical delay (EVD) data mat files on an epoch-by-epoch basis. Epoch delay fit data files and epoch EVD data files reside in fit directories, each associated with a specified time interval. For each fit directory, an epoch delay fit summary mat file is written that contains variables describing the observational data and options used to perform delay estimation over the time interval associated with that directory.

At step 606, the threat error delay is evaluated by calculating the residual difference between the estimated slant delay at the IPPs and the corresponding observed delay (both projected to vertical). This step outputs delay residuals on an epoch-by-epoch basis in epoch threat delay error data mat files. The residuals output correspond to measurements whose ionospheric pierce points lie in the threat domain of each fit. All threat domain residuals are saved, or, optionally, only those corresponding to the maximal $\sigma_{undersampled}$ value (greater than zero) obtained in each threat domain over the duration in which the fit is operative.

At step 608, the maximum residual differences are tabulated as a function of the IPPs distribution metrics. More specifically, the threat delay error is tabulated by tabulating the maximum $\sigma_{undersampled}$ binned as a function of two IPP distribution metrics. This step outputs bin matrices for specified data durations in threat delay error bin data files (e.g., each bin file generally corresponds to a single day of observational data). A record of the state of the extreme storm detector (ESD) as a function of time for each data deprivation mask is written to an ESD state file.

At step 610, raw data that are to be used to define each component of the ionospheric threat model are assembled. For each component, access to data files generated in steps 602-608 is output to a threat model raw data mat file on a storm-by-storm basis.

At step 612 the maximum $\sigma_{undersampled}$ data from all the storms that comprise each threat model component are merged, and an overbound is constructed that increases monotonically as a function of each IPP distribution metric. After plotting the raw data and the overbound as two-dimensional pixel plots, step 612 outputs the data plotted as columns in, respectively, an ASCII threat model raw data bin data file and an ASCII threat model overbound bin data file.

At step 614, for each threat model component, diagnostic files are generated based upon the merged data of step 612, consisting of columns of data that identify the origin of each maximum $\sigma_{undersampled}$. Step 614 writes a table of critical points and a table of all the maximum $\sigma_{undersampled}$ values, respectively, to an ASCII critical points table file and to an ASCII max sigmas table file.

At step 616, for each component, a threat model summary mat file is written that contains a threat model structure specifying the threat model component and access to all the information required to produce the threat model component.

At step 618, a composite threat model is built. Step 618 merges the components of the threat model (if the threat model has multiple components) and repeats steps 612-616, generating an analogous set of output files that now contain data for the complete threat model rather than its individual components.

Once a threat model has been generated, the user can use a reporting script to produce additional plots and generate other data that describe the threat model. In addition, the user can create a report that plots threat delay error diagnostics and, optionally, plots each sector of the threat model (i.e., the contribution of each storm day to the overall threat model). Additional reporting functionality can be used to produce plots and generate data that describe the behavior of the extreme storm detector for the set of storms included in the threat model. Reporting functionality can also calculate a table of extreme storm detector trip times and plot the storm threat metric vs. the maximum extreme storm detector (ESD) metric.

Some analysis scripts compare the results of two threat model computations. In order for these scripts to operate properly, the primary directory of each threat model computation (i.e. the directory storing all the results of the computation) should reside in the same root directory. The primary directory of a threat model computation may be moved to a new root directory; subsequent calls to scripts that read output data from this computation will automatically convert pathnames needed for accessing these data, based upon the path of the directory in which the primary directory resides. Subdirectories of the primary directory of a given threat model computation should never be moved to a new location relative to the location of the primary directory.

Broadcast Data Computation

For a given observational data set, the ionospheric grid delays (IGDs) and the grid ionospheric vertical errors (GIVEs) that WAAS would broadcast can be calculated by executing an additional script. Such a script performs various calculations and requires, as input, specification of the ionospheric threat model to be used to evaluate the GIVEs. By default, a movie is generated that superimposes the observed slant delay, converted to vertical and plotted at the location of each observation IPP, onto a grid with IGD values plotted at each grid point.

Options

Scripts in embodiments of the invention frequently use a standard convention for handling options. The convention consists of introducing into a function's argument list an "options" structure whose members specify only those option values that are to differ from their default values. The usage statement, usually displayed by typing the function name with no arguments, lists the complete set of valid options and their default values. For example, typing:

validate_delay_threat_model while running in a UNIX environment produces the following usage statement:

```
validate_delay_threat_model( options )
default options:
              archive:
    'IonoSTAGE_benchmarks/official_
                       validation/v-delay_threat_model'
    irreg_metric_threshold: [ ]
              model_abrv: 'kr'
         test_class_path: 'v-delay_threat_model'
                     icc: 'JPL'
           test_case_ids: 1
                  window: 1
```

To run the validation of threat model test case 2 using the planar fit model, it is sufficient for the user to define an options structure as follows, options=struct('test_case_ids', 2, 'model_abrv', 'pf') and then execute validate_delay_threat_model as indicated by the usage statement. The other options will assume their default values.

Advantages

In summary, embodiments of the invention provide the ability to analyze ionospheric slant TEC based on GNSS measurements. Such an embodiment has many advantages including efficiency, validation, maintainability, ease of use, and modularity. Each of these advantages is discussed below.

Efficiency

Analysis of ionospheric STEC is broken up into multiple stages. It is often the case that an embodiment of the invention can generate a new threat model by incorporating some of the results of a prior threat model computation. In this regard, the analysis has been structured to output sets of files at different stages of the computation: (1) epoch delay fit data files and epoch EVD files containing, respectively, fit parameters and equivalent vertical delay estimates (typically about 70% of the computation); (2) epoch threat delay error data files containing fit residuals (about 29% of the computation); and (3) threat delay error bin data files containing binned data (e.g., $\sigma_{undersampled}$ values—less than 2% of the computation). When a threat model parameter change affects only the binning of data (which is frequently the case), the analysis engine can recompute the threat model without recomputing the fits and the residual error—the multi-day computation of the first threat model can thereby be reduced to a computation requiring less than two hours.

Further, the threat model contains a large number of input variables that can be adjusted. The ability to compute threat models efficiently enables the performance of trade studies that might not otherwise be feasible, e.g. trade-offs between integrity and availability as functions of one or more input parameters. For example, embodiments of the invention are well-suited to studying the impact of varying the irregularity detector threshold. Once the base line threat model has been computed, a multi-day calculation that need only be done once, threat models corresponding to the other 9 values of the irregularity detector threshold can be achieved in 31.5 hours (9 threat models*3.5 hours of computation per threat model).

The importance of optimization should not be underestimated. The $\sigma_{undersampled}$ values tabulated in the ionospheric threat model usually represent the dominant component of the GIVE, i.e., they are critical in determining the WAAS broadcast error bounds. The size of the broadcast error bounds, in turn, influences system availability. Changes in system availability can have enormous economic consequences (for the FAA and for the nation). The efficiency of the computations (in embodiments of the invention) makes it possible to perform trade studies (e.g., involving irregularity detector thresholds, threat model metrics that characterize IPP distributions, ESD parameters, etc.) that offer the potential of significantly improving WAAS availability in future releases.

Algorithm Validation

The generation of output files at various stages of the computation has proven highly useful for debugging. When an embodiment of the invention begins each of these stages, it first checks to see whether any of the output files for that stage already exists. Any such files that do exist are not recomputed (e.g., files may not be overwritten). The original purpose of this feature was to permit continuation of an interrupted run without requiring the recomputation of all the results obtained prior to the interruption. However, this feature has also aided the detection of sources of discrepancy between the present invention's embodiment and other threat model analysis tools.

Detecting sources of discrepancy has often involved examination of the calculation of a single critical point, which, in general can occur anywhere in the middle of a multi-day run. For example, if one wishes to stop computations at the place where the fit associated with the critical point is calculated, one need only set a breakpoint at the appropriate line of code and then remove (or rename) the previously computed output epoch EVD file, associated with that epoch, containing the delay estimates in question. Since an embodiment of the invention does not have to recompute delay estimates associated with any other epoch, it will arrive at the line in question in, at most, a matter of minutes, no matter how long it took to arrive at this line in the original computation.

While this may seem like a small benefit, it is instructive to consider the cost of how the same issue has, in the past, been addressed in prior art analysis tools (e.g. by Raytheon™) during the intercode comparison. In the prior art, to stop at the analogous point of the computation without recomputing all the prior fits in the original computation, a separate version of the tool was created and various for loops were edited by hand to avoid unwanted computations. In the short term this was a satisfactory approach. As time went on, however, a concern arose regarding a possible divergence in the evolution of the original WAAS tool and the modified version, i.e., there was no confidence that all modifications of the original code were correctly incorporated into the "debug" version, and, hence, it was unclear whether the two versions were continuing to produce the same results. The ensuing confusion served to impede completion of the task.

Maintainability

A current embodiment of the invention adheres closely to the coding standards used in the development of the various tools. The only significant exception concerns the prohibition on the use of persistent variables. This embodiment of the invention uses two persistent variables as system variables only; no data computations are performed with persistent variables. It should also be noted that nearly all modules may have at least one underscore in the module name, thereby helping to ensure that no Matlab™ functions are used as keywords. The only exceptions are the startup module and conversion utilities that adhere to a standard naming convention for conversion functions, i.e., function names of the form XXX2YYY.

Development has benefited from the novel manner in which function options are handled. The implementation of options as described above generally follows a standard pattern. In the initial lines of the function, all possible members of options are defined in a default structure. (Note: the default value of the options structure itself is always [ ].) The function display_structure is used to display the members of the default structure in the usage statement, and the function update_structure is used to construct the updated options structure from the default structure and any option values defined in the input options. It should also be noted that update_structure performs error checking: if the user defines a member of the input options structure that does not match any of the members defined in the default structure, an error message is reported and execution terminated.

One advantage of this approach is the ease with which new options can be introduced into the code. Consider, for example, introducing a new option qqq for defining a new IPP coverage metric (e.g., to replace the relative centroid). All that is needed is to introduce qqq into a structure returned by the function "set_ipp_coverage_constants" and give it a default value. This option is now available in all scripts that already have access to this structure without any further coding changes. If the user wishes to change the option value at the command line in the example above, the user need only type:

options.fit_options.epoch.ipp_coverage_constants.qqq=4;

Furthermore, no additional coding is required for error checking To be more specific, embodiments of the invention verify that any options defined in the manner above are valid. For example, it will flag a typographical error that replaces 'qqq' with 'qqw'. The absence of such error checking in the prior art threat model tool can and has resulted in considerable confusion when an analogous error was written into an option structure of the prior art tool: the code happily accepted the 'new' option (qqw) without updating the value of the intended target (qqq). Consequently, the user thought results were generated using the new value for qqq when, in fact, they had been generated using the default value. This was not an easy error to detect.

Ease of Use

Ease of execution for scripts of embodiments of the invention has also benefited from the manner in which function options are implemented. All options used to generate a threat model, for example, are accessible from the command line. Further, default values are easily retrieved and the user may only need to specify those options whose values are to differ from their default values.

Modularity

The development of embodiments of the invention may emphasize modularity as a means of making code manageable and reusable. Integrating the estimation tool with the threat model tool has had the advantage of building the estimation tool upon many Matlab™ modules that have already been validated in the threat model tool (i.e., via the intercode comparison). A further example of the benefits of modularity is that delay estimation models (e.g., planar fit, multi-cone) have been implemented so as to be interchangeable, i.e., analysis and plotting tools are independent of the delay model chosen. This facilitates a ready comparison between the results generated by distinct delay models.

Logical Flow

Figure 7:
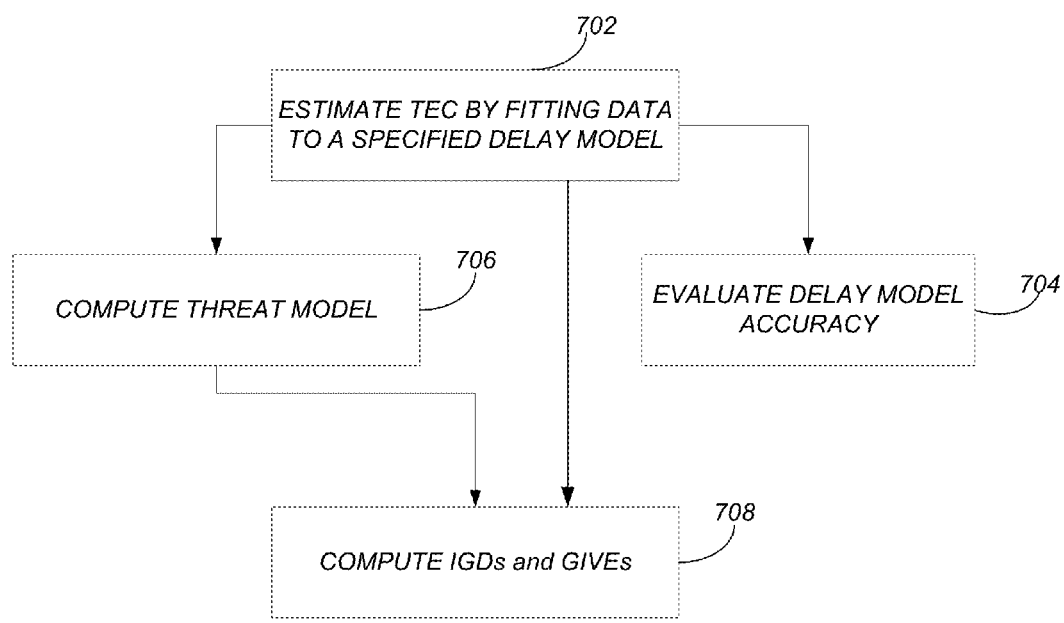
FIG. 7 illustrates the logical flow for analyzing ionospheric slant TEC using GNSS-based estimation in accordance with one or more embodiments of the invention.

FIG. 7 illustrates the logical flow for analyzing ionospheric slant TEC using GNSS-based estimation in accordance with one or more embodiments of the invention.

At step 702, slant TEC for a given set of raypath geometries are estimated by fitting historical (GNSS) data to a specified (delay) model. As described above, estimation may be performed at fit centers that are actual ionospheric grid points (IGPs) or pseudo-IGPs. The delay estimation models that may be used include a planar fit model, kriging model, conical domain model, and multi-cone model. The computation of slant TEC estimates is separated into three stages (or four if a multi-cone model is used) (see FIG. 5 above).

At step 704, the accuracy of the delay model is evaluated. Such an evaluation includes the calculation and analysis of delay estimate residuals (estimated TEC-observed TEC). Various figures showing the delay model behavior may also be plotted. The evaluation/analysis may be separated into two stages (with each stage having its distinct set of output files).

At step 706, a WAAS ionospheric threat model is computed (i.e., based on the specified delay model). The computation of a threat model may be separated into eight or nine stages as described above. Once generated, plots and other data that describe the model may be generated. Further, multiple computed threat models may be compared to each other.

At step 708, from a given observational data set (and from a set of delay estimates computed at step 702) and based on the ionospheric threat model computed in step 706 (i.e., which is used as input to the analysis), the ionospheric grid delays (IGDs) and grid ionospheric vertical errors (GIVEs) that WAAS would broadcast is calculated/computed. Plots/graphs of the computations may also be generated at this step.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

Abramowitz, M. and I. A. Stegun, eds. (1964), Handbook of Mathematical Functions With Formulas, Graphs, and Mathematical Tables, NBS Applied Mathematics Series 55, National Bureau of Standards, Washington, D.C.;

Blanch, J. (2002), An Ionosphere Estimation Algorithm for WAAS Based on Kriging, Proceedings of the 15$^{th}$ International Technical Meeting of the Satellite Division of the Institute of Navigation (ION GPS 2002), Portland, Oreg., 816-823;

Blanch, J. (2003), Using Kriging to Bound Satellite Ranging Errors Due to the Ionosphere, Ph.D. thesis, Stanford University, Stanford, Calif. (available online at waas.stanford.edu);

Cressie, N. A. C. (1993), Statistics for Spatial Data, revised edition, John Wiley and Sons, New York;

Komjathy, A., L. Sparks, A. Mannucci, and A. Coster (2005), The ionospheric impact of the October 2003 storm event on Wide Area Augmentation System, GPS Solutions, 9: 41-50, doi:10.1007/s10291-004-0126-2;

Mannucci, A. J., B. D. Wilson, D. N. Yuan, C. H. Ho, U. J. Lindqwister, and T. F. Runge (1998), A global mapping technique for GPS-derived ionospheric total electron content measurements, Radio Science, 33 (3), 565-582;

Minimum Operational Performance Standards for Global Positioning System/Wide Area Augmentation System Airborne Equipment, (WAAS MOPS), RTCA Document Number DO-229C, 28 Nov. 2001;

Sparks, L. (2013), Ionospheric Slant TEC Analysis Using GNSS-based Estimation (IonoSTAGE), JPL-D 34117, Jet Propulsion Laboratory, Pasadena, Calif.;

Sparks, L., J. Blanch, and N. Pandya (2010a), Estimation of Ionospheric Delay Using Kriging and its Impact on WAAS Availability, Proceedings of the International Beacon Satellite Symposium 2010, Technical University of Catalonia, Barcelona, Spain;

Sparks, L., J. Blanch, and N. Pandya (2010b), Kriging as a Means of Improving WAAS Availability, Proceedings of the 23$^{rd}$ International Technical Meeting of the Satellite Division of the Institute of Navigation (ION GNSS 2010), Portland, Oreg., 2013-2020;

Wackernagel, Hans (2003), Multivariable geostatistics: an introduction with applications, third edition, New York: Springer-Verlag;

Walter, T., A. Hansen, J. Blanch, P. Enge, A. Mannucci, X. Pi, L. Sparks, B. Iijima, B. El-Arini, R. Lejeune, M.

Hagen, E. Altshuler, R. Fries, and A. Chu (2000), Robust Detection of Ionospheric Irregularities, Navigation 48, 89-100;

Webster, R. and M. Oliver (2001), Geostatistics for Environmental Scientists, John Wiley and Sons, New York;

Zumberge, J. F., M. B. Heflin, D. C. Jefferson, M. M. Watkins, F. H. Webb (1997), Precise point positioning for the efficient and robust analysis of GPS data from large networks, J. Geophys. Res., 102 (B3), 5005-5017;

Algorithm Description Document for the Grid Ionospheric Vertical Error (GIVE) Monitor of the Wide Area Augmentation System, CDRL Sequence No. A014-006H, prepared for the Federal Aviation Administration by the Raytheon Company, Jul. 14, 2010;

Altshuler, E., R. Fries, L. Sparks, "The WAAS Ionospheric Spatial Threat Model," Proc. of ION GPS 2001, Institute of Navigation, Salt Lake City, Utah, September 2001;

Paredes, E., N. Pandya, L. Sparks, and A. Komjathy, "Reconstructing the WAAS Undersampled Ionospheric Gradient Threat Model for the WAAS Expansion into Mexico," in Proc. of ION GNSS 2008, Institute of Navigation, Savannah, Ga., September 2008;

Sparks, L., X. Pi, A. J. Mannucci, T. Walter, J. Blanch, A. Hansen, P. Enge, E. Altshuler, and R. Fries, "The WAAS Ionospheric Threat Model," Proc. of the International Beacon Satellite Symposium 2001, Boston, Mass., June 2001;

Sparks, L., A. Komjathy, and A. J. Mannucci, "Sudden Ionospheric Delay Decorrelation and Its Impact on the Wide Area Augmentation System (WAAS)" Radio Sci., 39, RS1S13, doi:10.1029/2002RS002845, 2004;

Sparks, L. A., Komjathy, and A. J. Mannucci, "SBAS Estimation of Ionospheric Delay in the Presence of a Highly Structured Ionosphere," Proceedings of the Beacon Satellite Symposium 2004, Trieste, Italy, October, 2004;

Sparks, L., A. Komjathy, A. J. Mannucci, E. Altshuler, T. Walter, J. Blanch, M. B. El-Arini, and R. Lejeune, "Extreme Ionospheric Storms and Their Impact on WAAS," Proc. of the $11^{th}$ International Ionospheric Effects Symposium 2005 (IES 2005), Alexandria, Va., May 2005;

Sparks, L., E. Altshuler, N. Pandya, and E. Paredes, "Validation of the Computation of the WAAS Ionospheric Threat Model—Final Report on the Intercode Comparison for Release 8/9", delivered to the WAAS Integrity and Performance Panel (WIPP), Oct. 1, 2008;

Sparks, L. A., Komjathy, and A. J. Mannucci, "Conical-Domain Model for Estimating GPS Ionospheric Delays," Software Tech Briefs, Supplement to NASA Tech Briefs, Sep. 4, 2009A;

Sparks, L. A., Komjathy, and A. J. Mannucci, "Multi-Cone Model for Estimating GPS Ionospheric Delays," NASA Tech Briefs, Oct. 1, 2009B.

Sparks, L., N. Pandya, B. Thompson, and E. Altshuler, "Validation of the Computation of the WFO Release 3 Ionospheric Threat Model—Report on the Intercode Comparison", delivered to the WAAS Integrity and Performance Panel (WIPP), Apr. 30, 2010;

Sparks, L., J. Blanch, and N. Pandya, "Estimating ionospheric delay using kriging: 1. Methodology," Radio Sci., 46, RSOD21, doi:10.1029/2011RS004667, 2011A; and Sparks, L., J. Blanch, and N. Pandya, "Estimating ionospheric delay using kriging: 2. Impact on satellite-based augmentation system availability," Radio Sci., 46, RSOD22, doi:10.1029/2011RS004781, 2011B.

What is claimed is:

1. A computer-implemented method for analyzing ionospheric slant total electron content (TEC) using global navigation satellite systems (GNSS)-based estimation comprising:
    estimating slant TEC for a given set of raypath geometries by fitting historical GNSS data to a specified delay model;
    evaluating an accuracy of the specified delay model by calculating delay estimate residuals and plotting a behavior of the delay estimate residuals;
    computing an ionospheric threat model based on the specified delay model, wherein the computing of the ionospheric threat model is performed in multiple stages, wherein each stage generates a distinct set of output files;
    computing a second ionospheric threat model with new options, by reusing one or more of the files in the distinct set of output files, wherein the second ionospheric threat model is used to protect users from effects of ionospheric irregularities;
    computing ionospheric grid delays (IGDs) and grid ionospheric vertical errors (GIVEs) based on the ionospheric threat model; and
    outputting the second ionospheric threat model, wherein the second ionospheric threat model is applied to the GNSS.

2. The computer-implemented method of claim 1, wherein the delay estimation model comprises a planar fit model.

3. The computer-implemented method of claim 1, wherein the delay estimation model comprises a kriging model.

4. The computer-implemented method of claim 1, wherein the delay estimation model comprises a conical domain model.

5. The computer-implemented method of claim 1, wherein the delay estimation model comprises a multi-cone model.

6. The computer-implemented method of claim 1, wherein the stages comprise:
    converting observational GNSS data from a first format to a second format that is written to an observed delay data file;
    estimating vertical delay by fitting actual GNSS data to the specified delay model that results in fit data that are written to an epoch delay fit data file; and
    estimating slant delay for the given set of raypath geometries by fitting the historical GNSS data to the specified delay model over a specified set of time durations, wherein the fitting results are written to output files, and input parameters and file access data are written to a delay estimation summary file.

7. The computer-implemented method of claim 6, wherein the estimating slant delay further comprises using a conical domain approach to evaluate pseudo-observations corresponding to the given set of raypath geometries that link satellites to target points, wherein the pseudo-observations are written to a pseudo observation data file.

8. The computer-implemented method of claim 1, wherein the evaluating the accuracy of the specified delay model is decomposed into stages, wherein the stages comprise:
    tabulating residual differences between the estimated slant TEC and observed TEC, wherein the residual differences are output in a delay residual bin data file; and writing a delay model accuracy summary file that contains variables specifying the specified delay model, options used to generate the estimated slant TEC, and access to output generated.

9. The computer-implemented method of claim 1, wherein the computing the ionospheric threat model is decomposed into stages that each output a corresponding output file, wherein the stages comprise:
converting observational GNSS data from a first format into a second format;
evaluating the specified delay model by estimating vertical delay of the observational GNSS data by fitting the observational GNSS data to the specified delay model;
evaluating a threat delay error by calculating a residual difference between the estimated vertical delay and corresponding observed delay that has been projected to vertical;
tabulating maximum residual differences as a function of ionospheric pierce points (IPPs) distribution metrics;
assembling raw data to be used to define each threat model component of the ionospheric threat model;
merging the maximum residual differences from multiple storms that comprise each of the threat model components and constructing an overbound that increases monotonically as a function of each of the IPP distribution metrics;
generating, for each threat model component, a diagnostic file based on the merging;
writing, for each threat model component, a threat model summary file that comprises a threat model structure specifying the threat model component and access to information required to produce the threat model component; and
building a composite threat model by merging the threat model components of the threat model.

10. A non-transitory computer readable storage medium encoded with computer program instructions which when accessed by a computer cause the computer to load the program instructions to a memory therein creating a special purpose data structure causing the computer to operate as a specially programmed computer, executing a method of analyzing ionospheric slant total electron content (TEC) using global navigation satellite systems (GNSS) based estimation, comprising:
estimating, in the specially programmed computer, slant TEC for a given set of raypath geometries by fitting historical GNSS data to a specified delay model;
evaluating, in the specially programmed computer, an accuracy of the specified delay model by calculating delay estimate residuals and plotting a behavior of the delay estimate residuals;
computing, in the specially programmed computer, an ionospheric threat model based on the specified delay model, wherein the computing of the ionospheric threat model is performed in multiple stages, wherein each stage generates a distinct set of output files;
computing, in the specially programmed computer, a second ionospheric threat model with new options, by reusing one or more of the files in the distinct set of output files, wherein the second ionospheric threat model is used to protect users from effects of ionospheric irregularities;
computing, in the specially programmed computer, ionospheric grid delays (IGDs) and grid ionospheric vertical errors (GIVEs) based on the ionospheric threat model; and
outputting the second ionospheric threat model, wherein the second ionospheric threat model is applied to the GNSS.

11. The computer readable storage medium of claim 10, wherein the delay estimation model comprises a planar fit model.

12. The computer readable storage medium of claim 10, wherein the delay estimation model comprises a kriging model.

13. The computer readable storage medium of claim 10, wherein the delay estimation model comprises a conical domain model.

14. The computer readable storage medium of claim 10, wherein the delay estimation model comprises a multi-cone model.

15. The computer readable storage medium of claim 10, wherein the stages comprise:
converting, in the specially programmed computer, observational GNSS data from a first format to a second format that is written to an observed delay data file;
estimating, in the specially programmed computer, vertical delay by fitting actual GNSS data to the specified delay model that results in fit data that are written to an epoch delay fit data file; and
estimating, in the specially programmed computer, slant delay for the given set of raypath geometries by fitting the historical GNSS data to the specified delay model over a specified set of time durations, wherein an output file generated from the fitting comprises results of the fitting and a delay estimation summary file comprises information specifying the specified delay model and options used to generate the estimated slant delay.

16. The computer readable storage medium of claim 15, wherein the estimating slant delay comprises using a conical domain approach to evaluate pseudo-observations corresponding to the given set of raypath geometries that link satellites to target points, wherein the pseudo-observations are written to a pseudo observation data file.

17. The computer readable storage medium of claim 10, wherein the evaluating the accuracy of the specified delay model comprises is decomposed into stages, wherein the stages comprise:
tabulating, in the specially programmed computer, residual differences between the estimated slant TEC and observed TEC, wherein the residual differences are output in a delay residual bin data file; and
writing, in the specially programmed computer, a delay model accuracy summary file that contains variables specifying the specified delay model, options used to generate the estimated slant TEC, and access to output generated.

18. The computer readable storage medium of claim 10, wherein the computing the ionospheric threat model is decomposed into stages that each output a corresponding output file, wherein the stages comprise:
converting, in the specially programmed computer, observational GNSS data from a first format into a second format;
evaluating, in the specially programmed computer, the specified delay model by estimating vertical delay of the observational GNSS data by fitting the observational GNSS data to the specified delay model;
evaluating, in the specially programmed computer, a threat delay error by calculating a residual difference between the estimated vertical delay and corresponding observed delay that has been projected to vertical;

tabulating, in the specially programmed computer, maximum residual differences as a function of ionospheric pierce points (IPPs) distribution metrics;

evaluating, in the specially programmed computer, threat model data by assembling raw data to be used to define each threat model component of the ionospheric threat model;

merging, in the specially programmed computer, the maximum residual differences from multiple storms that comprise each of the threat model components and constructing an overbound that increases monotonically as a function of each of the IPP distribution metrics;

generating, in the specially programmed computer, for each threat model component, a diagnostic file based on the merging;

writing, in the specially programmed computer, for each threat model component, a threat model summary file that comprises a threat model structure specifying the threat model component and access to information required to produce the threat model component; and building, in the specially programmed computer, a composite threat model by merging the threat model components of the threat model.

* * * * *